United States Patent
Ueda

(10) Patent No.: US 10,847,200 B2
(45) Date of Patent: Nov. 24, 2020

(54) MAGNETIC STORAGE DEVICE

(71) Applicant: TOSHIBA MEMORY CORPORATION, Tokyo (JP)

(72) Inventor: Yoshihiro Ueda, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/297,819

(22) Filed: Mar. 11, 2019

(65) Prior Publication Data
US 2020/0082865 A1    Mar. 12, 2020

(30) Foreign Application Priority Data
Sep. 12, 2018   (JP) ................................ 2018-170482

(51) Int. Cl.
*G11C 11/16*    (2006.01)

(52) U.S. Cl.
CPC ...... *G11C 11/1675* (2013.01); *G11C 11/1655* (2013.01); *G11C 11/1673* (2013.01)

(58) Field of Classification Search
CPC ............ G11C 11/1675; G11C 11/1673; G11C 11/1655; G11C 19/0841; G11C 19/0875
See application file for complete search history.

(56) References Cited

U.S. PATENT DOCUMENTS

| | | | |
|---|---|---|---|
| 3,585,371 A * | 6/1971 | Dowling | ................... H03K 3/78 377/56 |
| 6,947,315 B2 | 9/2005 | Iwata | |
| 8,331,125 B2 * | 12/2012 | DeBrosse | ................. G11C 8/10 365/80 |
| 9,858,974 B1 * | 1/2018 | Kondo | ................. G11C 11/1673 |
| 2006/0120132 A1 * | 6/2006 | Parkin | ...................... G11C 11/14 365/80 |
| 2010/0208504 A1 * | 8/2010 | Kim | .................... G11C 19/0841 365/80 |
| 2011/0051490 A1 * | 3/2011 | DeBrosse | ................. G11C 8/10 365/80 |
| 2011/0069541 A1 * | 3/2011 | Ono | ..................... G11C 19/0808 365/171 |
| 2013/0033917 A1 * | 2/2013 | Shen | ....................... G11C 11/14 365/80 |
| 2014/0141530 A1 * | 5/2014 | Gaidis | ................. G11C 11/1659 438/3 |

(Continued)

FOREIGN PATENT DOCUMENTS

| JP | 2004-310880 A | 11/2004 |
|---|---|---|
| JP | 2019-164848 A | 9/2019 |

*Primary Examiner* — Khamdan N. Alrobaie
(74) *Attorney, Agent, or Firm* — Finnegan, Henderson, Farabow, Garrett & Dunner, L.L.P.

(57) ABSTRACT

According to an embodiment, a magnetic storage device includes a magnetic member, a switch element, a shift control circuit, a base current control circuit, and a controller. The magnetic member includes a portion extending in a direction. The switch element is connected in series to the magnetic member, and maintains an on state in a case where a current equal to or larger than a holding current value continues to flow in the on state. The shift control circuit shifts magnetic domains retained in the magnetic member. The controller causes the base current control circuit to supply a base current to the switching element and causes the shift control circuit to supply a shift pulse current a plurality of times.

18 Claims, 13 Drawing Sheets

(56) References Cited

U.S. PATENT DOCUMENTS

| | | | |
|---|---|---|---|
| 2015/0078071 A1* | 3/2015 | Nakamura | G11C 11/161 |
| | | | 365/158 |
| 2015/0255710 A1* | 9/2015 | Nakamura | H01L 43/08 |
| | | | 365/158 |
| 2015/0262702 A1* | 9/2015 | Ootera | G11C 19/0808 |
| | | | 365/80 |
| 2015/0380638 A1* | 12/2015 | Ootera | G11C 11/1659 |
| | | | 257/421 |
| 2016/0056368 A1* | 2/2016 | Parkin | G11C 11/161 |
| | | | 438/3 |
| 2016/0267955 A1 | 9/2016 | Iwata | |
| 2018/0040372 A1 | 2/2018 | Kang | |
| 2018/0075895 A1 | 3/2018 | Kishi et al. | |
| 2019/0287593 A1* | 9/2019 | Ueda | H01L 27/222 |

\* cited by examiner

MAGNETIC STORAGE DEVICE

CROSS-REFERENCE TO RELATED APPLICATIONS

This application is based upon and claims the benefit of priority from Japanese Patent Application No. 2018-170482, filed on Sep. 12, 2018; the entire contents of which are incorporated herein by reference.

FIELD

Embodiments described herein relate generally to a magnetic storage device.

BACKGROUND

Magnetic storage devices using magnetic members have been proposed. Further, there are also known storage devices using a selector element between two terminals that changes from an off state to an on state in a case where a voltage equal to or larger than a predetermined value is applied. In such a storage device, a spike current occurs when the selector element between two terminals changes from the off state to the on state.

In the magnetic storage device using magnetic members, a spike current occurs every time a cell is selected. If the number of occurrences of the spike current increases, there is a high possibility that a retained magnetic domain is erroneously shifted or the element is destroyed.

DETAILED DESCRIPTION

Figure 1:
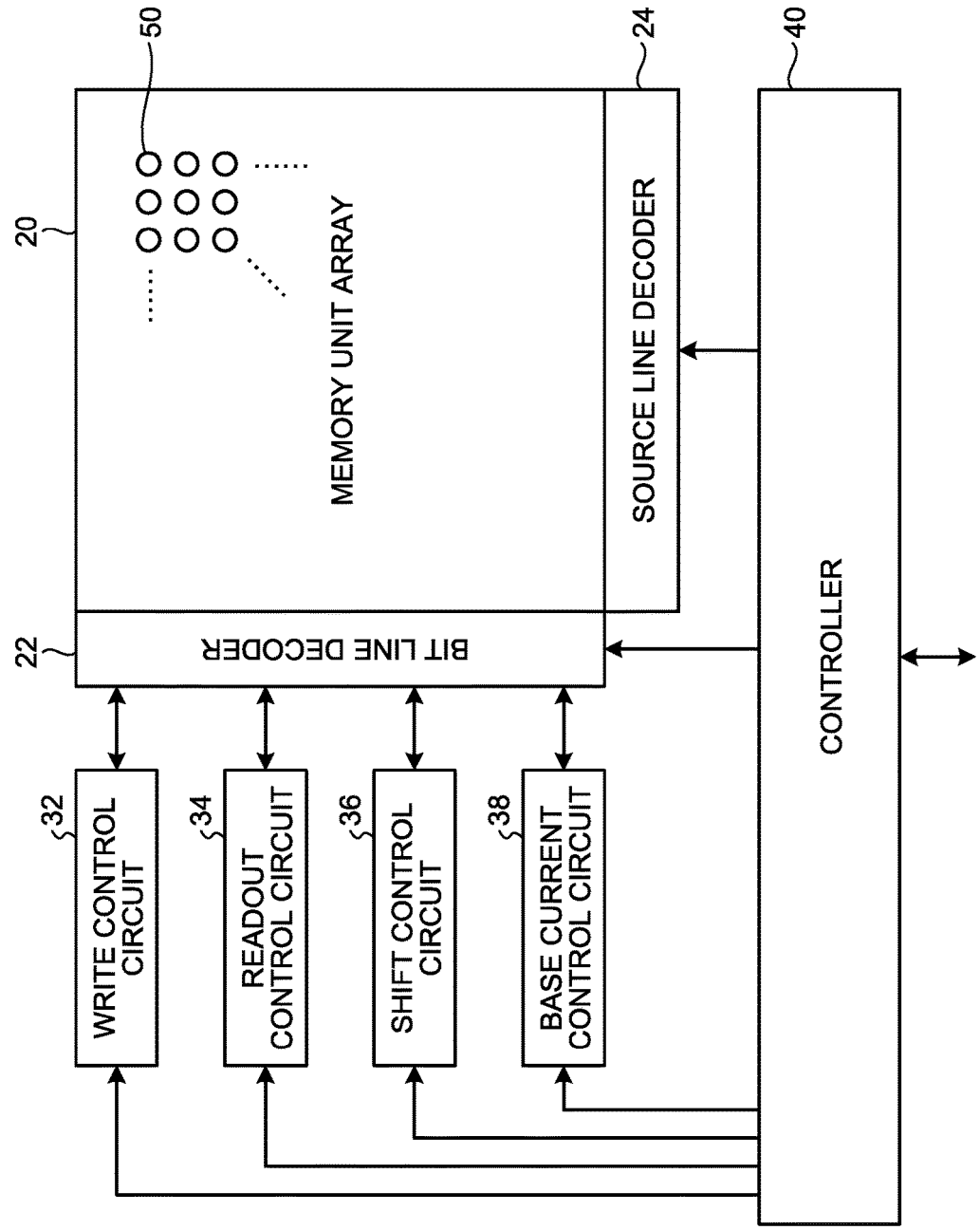
FIG. 1 is a diagram illustrating a configuration of a magnetic storage device according to an embodiment.

In general, according to one embodiment, a magnetic storage device is provided. The magnetic storage device includes a magnetic member, a switch element, a shift control circuit, a base current control circuit, and a controller. The magnetic member includes a portion extending in a direction. The switching element is connected in series to the magnetic member, changes to an on state in a case where a voltage equal to or larger than a predetermined value is applied in an off state, and maintains the on state in a case where a current equal to or larger than a holding current value continues to flow in the on state. The shift control circuit supplies a shift pulse current to the magnetic member via the switch element to shift a magnetic domain retained by the magnetic member. The base current control circuit supplies a base current equal to or larger than the holding current value to the switch element. After the switch element has changed from the off state to the on state, the controller causes the base current control circuit to supply the base current to the switch element during a predetermined continuous supply period, and causes the shift control circuit to supply the shift pulse current a plurality of times during the continuous supply period.

Exemplary embodiments of a magnetic storage device will be described below in detail with reference to the accompanying drawings. In the following description, constituent elements having the same function and configuration are denoted by the same reference numeral. In addition, each of the embodiments described below exemplifies a device and a method for embodying the technical idea of this embodiment, and does not specify the material, shape, structure, arrangement, and the like of constituent parts to those set as follows.

FIG. 1 is a diagram illustrating a configuration of a magnetic storage device 10 according to an embodiment. The magnetic storage device 10 is a storage device realized by a semiconductor device. The magnetic storage device 10 according to the embodiment is referred to as, for example, a magnetic domain wall displacement memory.

The magnetic storage device 10 is connected to an information processing circuit and the like via a bus or the like. The magnetic storage device 10 internally stores recording information received from the information processing circuit in response to an instruction from the information processing circuit. Further, the magnetic storage device 10 outputs the information stored therein to the information processing circuit in response to an instruction from the information processing circuit.

The magnetic storage device 10 includes a memory unit array 20, a bit line decoder 22, a source line decoder 24, a write control circuit 32, a readout control circuit 34, a shift control circuit 36, a base current control circuit 38, a controller 40.

The memory unit array 20 includes a plurality of bit lines BL, a plurality of source lines SL, and a plurality of field lines FL. The memory unit array 20 further includes a plurality of memory units 50 arranged in a matrix manner. Each of the plurality of memory units 50 magnetically stores information. Furthermore, each of the plurality of memory units 50 can retain and shift a magnetization state, using the principle of magnetic domain wall displacement. Note that further details of the memory unit 50 will be described below.

The bit line decoder 22 selects the bit line BL to which the memory unit 50 to be written or read is connected according to the control of the controller 40. The source line decoder 24 selects the source line SL to which the memory unit 50 to be written or read is connected according to the control by the controller 40.

The write control circuit 32 writes the recording information in the target memory unit 50 selected by the bit line decoder 22 and the source line decoder 24 according to the control of the controller 40 at the time of writing. The readout control circuit 34 reads information from the target memory unit 50 selected by the bit line decoder 22 and the source line decoder 24 according to the control of the controller 40 at the time of reading. The shift control circuit 36 shifts a magnetic domain retained by the target memory unit 50 according to the control of the controller 40 at the time of writing or reading. Note that further details of write processing, readout processing, and shift processing will be described below.

The base current control circuit 38 supplies a base current to the target memory unit 50 selected by the bit line decoder 22 and the source line decoder 24 to enable continuous read and write of information. Note that further details of the supply of the base current will be described below.

The controller 40 receives a readout command, a write command, or the like from the information processing circuit connected via the bus or the like. The controller 40 controls the bit line decoder 22, the source line decoder 24, the write control circuit 32, the readout control circuit 34, the shift control circuit 36, and the base current control circuit 38 according to the received command. As a result, the controller 40 can write and read information to and from the selected memory unit 50 among the plurality of memory units 50 included in the memory unit array 20.

Figure 2:
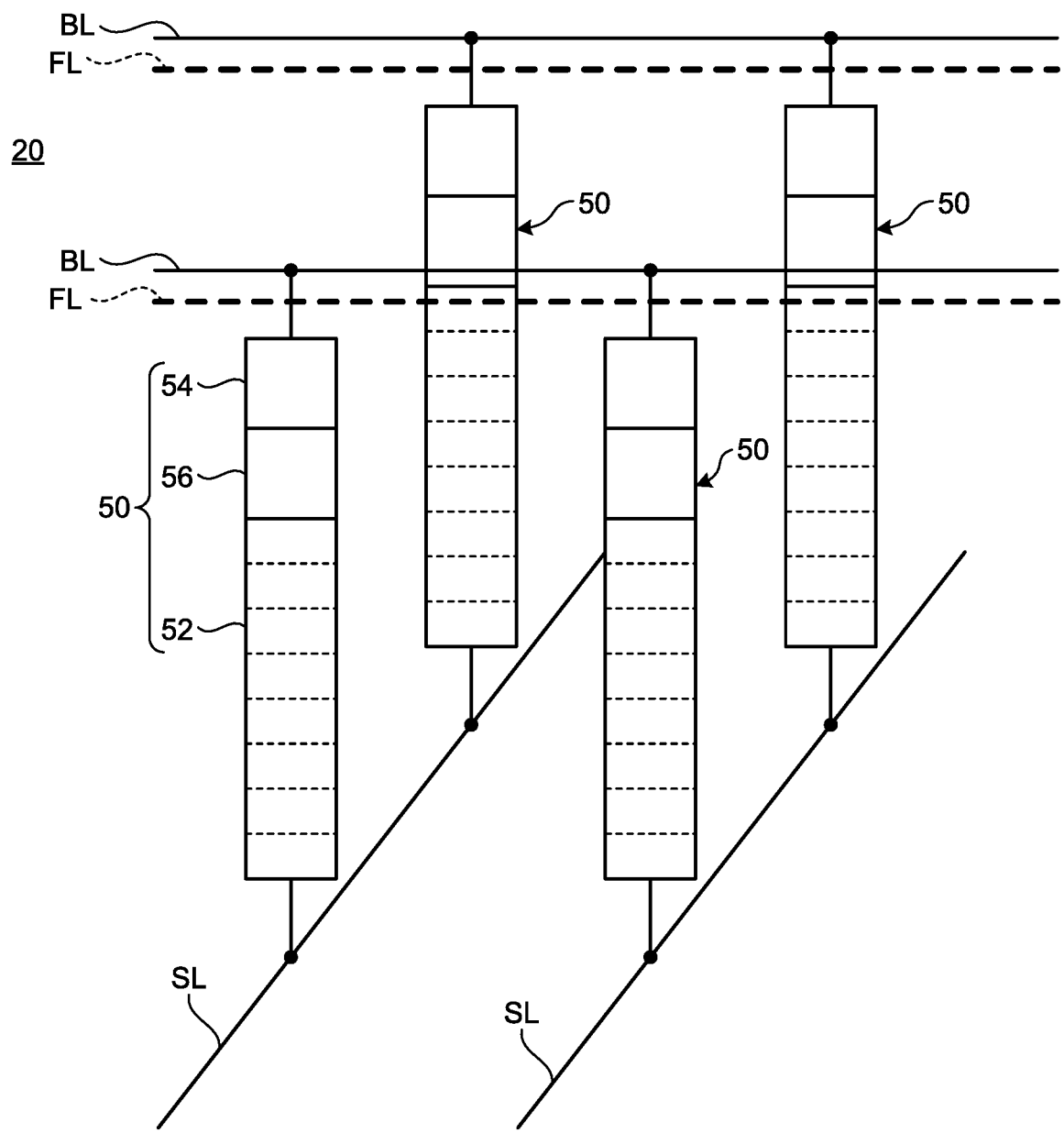
FIG. 2 is a diagram illustrating a configuration of a part of a memory unit array.

FIG. 2 is a diagram illustrating a configuration of a part of a memory unit array 20.

Each of the plurality of bit lines BL is substantially linear wiring formed in a predetermined layer in the semiconductor device. The plurality of bit lines BL is formed in parallel at equal intervals. For example, each bit line BL is formed to extend in an X direction.

Each of the plurality of source lines SL is linear wiring formed in a predetermined layer different from the layer in which the bit lines BL are formed in the semiconductor device. The plurality of source lines SL is arranged in parallel at equal intervals in a direction orthogonal to the plurality of bit lines BL. For example, each source line SL is formed to extend in a Y direction orthogonal to the X direction. For example, the plurality of source lines SL is formed in a layer different from the plurality of bit lines BL in a Z direction orthogonal to the X direction and the Y direction.

The plurality of field lines FL is wiring formed in a predetermined layer different from the layers in which the bit lines BL and the source lines SL are formed in the semiconductor device. The plurality of field lines FL is provided on a one-to-one basis with, for example, the plurality of bit lines BL. The plurality of field lines FL is arranged in parallel at equal intervals in the same direction as the plurality of bit lines BL. For example, each field line FL is formed to extend in the X direction. For example, the plurality of source lines SL is formed in a layer different from the layers of the plurality of bit lines BL and the plurality of source lines SL in the Z direction.

The plurality of memory units 50 is arranged in a matrix manner with respect to an X-Y plane. The plurality of memory units 50 is formed in a layer between the layer in which the plurality of bit lines BL is formed and the layer in which the plurality of source lines SL is formed. Each of the plurality of memory units 50 is provided at an intersection point between the bit line BL and the source line SL in the X-Y plane. Each of the plurality of memory units 50 has an elongated shape in the Z direction, and one end of the memory unit 50 is electrically connected to the corresponding bit line BL and the other end of the memory unit 50 is electrically connected to the corresponding source line SL. Further, each of the plurality of memory units 50 is magnetically connected to one of the plurality of field lines FL.

Each memory unit 50 includes a magnetic member 52 (MML), a selector element 54 (switch element), and a magnetoresistance effect element 56.

The magnetic member 52 is a linear ferromagnetic member. The magnetic member 52 is arranged to extend in the direction (Z direction) orthogonal to both the bit line BL and the source line SL.

The magnetic member 52 can retain a plurality of magnetic domains in the length direction (Z direction). Each of the magnetic domains is magnetized in one of a first direction and a second direction opposite to the first direction according to stored information. The magnetic member 52 shifts the retained magnetic domain in the length direction (Z direction) in response to the current flowing in the length direction (Z direction).

One end of the magnetic member 52 in the Z direction is electrically connected to the corresponding one source line SL. Further, the other end (an opposite end portion of the source line SL) of the magnetic member 52 in the Z direction can be electrically connected to the corresponding one bit line BL via the selector element 54 and the magnetoresistance effect element 56. Therefore, in a case where the selector element 54 is in an on state, the magnetic member 52 can move the retained magnetic domain in the length direction (Z direction) as the current is supplied from the corresponding bit line BL and the corresponding source line SL.

The selector element 54 is a two-terminal element connected in series to the magnetic member 52. More specifically, one end of the selector element 54 in the Z direction is electrically connected to the corresponding one bit line BL, and the other end is connected to an end portion of the magnetic member 52 on the side where the source line SL is not connected, via the magnetoresistance effect element 56.

The selector element 54 switches the state between the two terminals to an off state (high resistance state and non-conduction state) or an on state (low resistance state and conduction state). The selector element 54 is switched to the off state or the on state according to the voltage applied between the two terminals and the current flowing between the two terminals. In the case where the selector element 54 is in the off state, no current flows through the magnetic members 52 connected in series. In the case where the selector element 54 is in the on state, a current flows through the magnetic member 52 connected in series.

The selector element 54 changes to the on state when a voltage equal to or larger than a predetermined value is applied in the off state. Further, the selector element 54 maintains the on state in a case where a current equal to or larger than the holding current value ($I_{hold}$) continues to flow in the on state.

The selector element 54 may be, for example, a switch element between two terminals. In a case where the voltage to be applied between the two terminals is equal to or smaller than a threshold value, the switch element between two terminals is in the "high resistance" state, for example, is electrically in the non-conduction state. In a case where the voltage to be applied between the two terminals is equal to or larger than the threshold value, the switch element between two terminals changes to the "low resistance" state, for example, is electrically in the conduction state. The switch element between two terminals may have this function with either polarity of voltage. The switch element between two terminals may contain at least one type of chalcogen element selected from the group consisting of Te, Se, and S. Alternatively, the switch element between two terminals may contain chalcogenide that is a compound containing such a chalcogen element. The switch element between two terminals may also contain at least one type of element selected from the group consisting of B, Al, Ga, In, C, Si, Ge, Sn, As, P, and Sb.

The magnetoresistance effect element 56 is provided between the selector element 54 and the magnetic member 52. The magnetoresistance effect element 56 has conductivity. Therefore, the selector element 54 and the magnetic member 52 are electrically connected. With the electrical connection, in the case where the selector element 54 is in the on state, one end of the magnetic member 52 is electrically connected to the corresponding bit line BL via the selector element 54 and the magnetoresistance effect element 56.

In the magnetoresistance effect element 56, a resistance value varies according to a stored magnetization direction. In the present embodiment, the magnetoresistance effect element 56 is a magnetic tunnel junction (MTJ) element.

Figure 3:
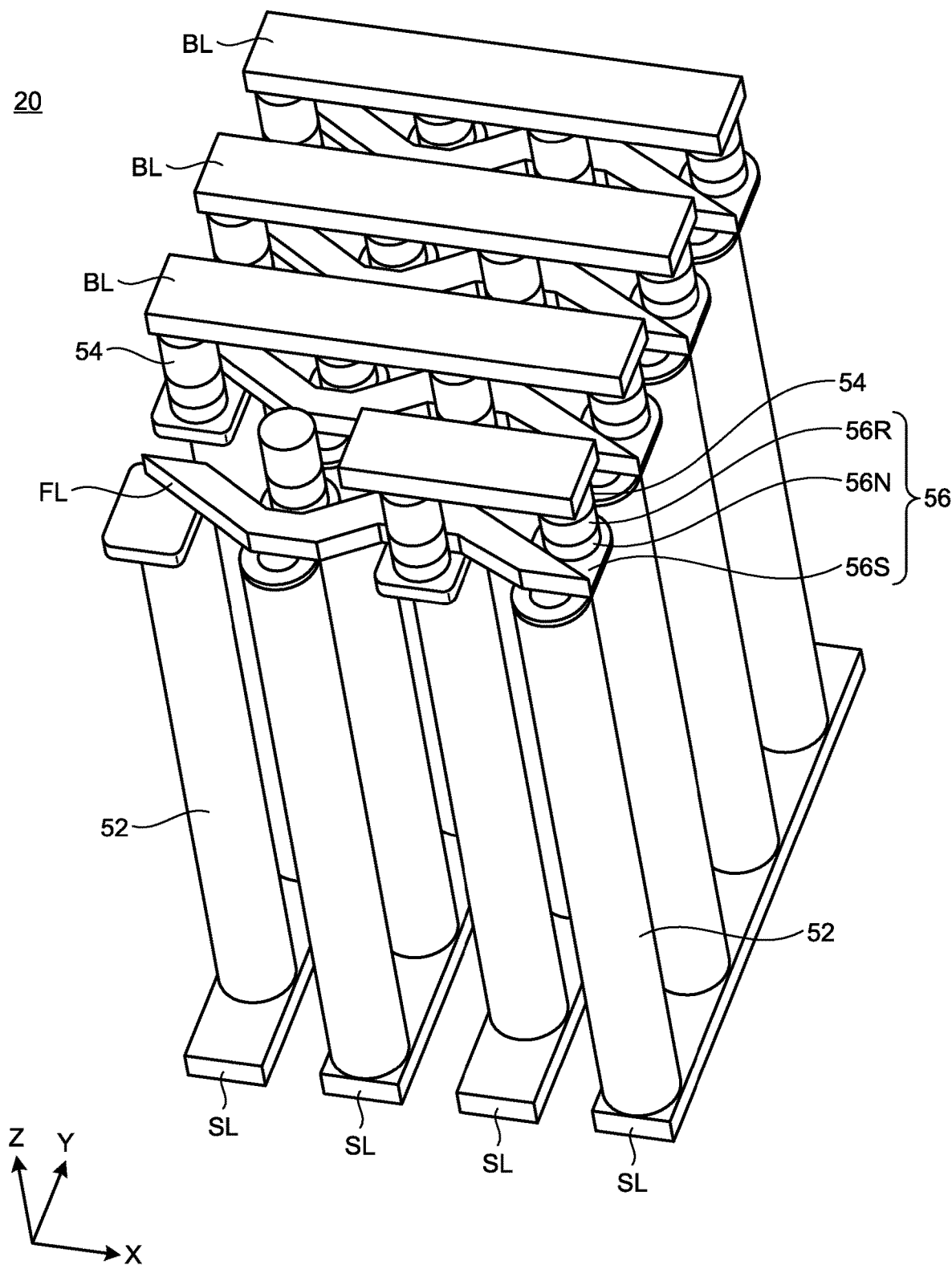
FIG. 3 is a perspective view schematically illustrating a structure of a part of the memory unit array.

FIG. 3 is a perspective view schematically illustrating a structure of a part of the memory unit array 20. The magnetic member 52 has, for example, a cylindrical shape. In the present embodiment, the magnetic member 52 has a shape with a hollow interior, but the magnetic member 52 may have a columnar shape without a hollow interior or may not have the cylindrical shape or the columnar shape.

One bottom surface of the magnetic member 52 is connected to one of the source lines SL. A bottom surface of the magnetic member 52 on the side opposite to the source line SL is connected to the magnetoresistance effect element 56.

The magnetoresistance effect element 56 includes a first magnetic layer 56S (memory layer), a nonmagnetic layer 56N, and a second magnetic layer 56R (reference layer). The first magnetic layer 56S is in contact with the bottom surface of the magnetic member 52 on the side where the source line SL is not connected. The second magnetic layer 56R is in contact with the selector element 54. The nonmagnetic layer 56N is arranged between the first magnetic layer 56S and the second magnetic layer 56R.

The first magnetic layer 56S is magnetized in a direction (an in-plane direction of an X-Y plane) parallel to a boundary surface between the first magnetic layer 56S, and the nonmagnetic layer 56N and the second magnetic layer 56R. At the time of reading, the magnetization direction of the first magnetic layer 56S is reversed according to the magnetization direction of the magnetic domain retained in the end portion of the magnetic member 52 on the side of the magnetoresistance effect element 56. The nonmagnetic layer 56N functions as a tunnel barrier.

The second magnetic layer 56R has magnetization in a fixed or unchanged direction, and has, for example, a coercive force larger than a coercive force of the first magnetic layer 56S. The magnetization direction of the second magnetic layer 56R is not reversed depending on the magnetization direction of the first magnetic layer 56S and the magnetization direction of the magnetic domain of the magnetic member 52. Here, the direction being fixed or unchanged means that the magnetization direction does not change with respect to a predetermined shift write current.

A set of the second magnetic layer 56R, the nonmagnetic layer 56N, and the first magnetic layer 56S exhibits the magnetoresistance effect. More specifically, when the magnetization direction of the first magnetic layer 56S and the magnetization direction of the second magnetic layer 56R are parallel and antiparallel, the set of the second magnetic layer 56R, the nonmagnetic layer 56N, and the first magnetic layer 56S exhibits minimum and maximum resistance values, respectively. In the case where the magnetization directions of the first magnetic layer 56S and the second magnetic layer 56R are parallel (in the same direction), the magnetoresistance effect element 56 is in the low resistance state, and in the case where the magnetization directions of the first magnetic layer 56S and the second magnetic layer 56R are antiparallel (in the opposite directions), the magnetoresistance effect element 56 is in the high resistance state.

The magnetization direction of the first magnetic layer 56S varies depending on the magnetization direction of the magnetic domain retained in the end portion (readout position) of the magnetic member 52 on the side of the magnetoresistance effect element 56. Therefore, the resistance value of the magnetoresistance effect element 56 varies depending on the magnetization direction retained by the magnetic domain in the end portion of the magnetic member 52 on the side of the magnetoresistance effect element 56. As a result, the magnetoresistance effect element 56 can function as a readout element that reads the magnetization direction of the magnetic domain retained at the readout position on the magnetic member 52. Note that the magnetoresistance effect element 56 may include further layers.

In addition, the bottom surface of the magnetic member 52, and the second magnetic layer 56R and the nonmagnetic layer 56N have different formation ranges in the X-Y plane. The first magnetic layer 56S is formed in a range including all of a region in contact with the bottom surface of the magnetic member 52 and a region in contact with the second magnetic layer 56R and the nonmagnetic layer 56N in the X-Y plane.

The field line FL is formed to pass through a region directly above the bottom surface of the cylindrical magnetic member 52 on the side opposite to the source line SL. Therefore, the end portion of the magnetic member 52 on the side of the magnetoresistance effect element 56 is in proximity to the source line SL via the first magnetic layer 56S. Therefore, a magnetic field generated by the current flowing through the field line FL is applied to the end portion of the magnetic member 52 on the side of the magnetoresistance effect element 56 via the first magnetic layer 56S.

In a case where a magnetic field generated by the current flowing through the field line FL is applied, a new magnetic domain is written in the end portion (write position) of the magnetic member 52 on the side of the magnetoresistance effect element 56 by an induction magnetic field. The new magnetic domain written in the end portion of the magnetic member 52 on the side of the magnetoresistance effect element 56 is magnetized in a direction according to the direction of the write current flowing through the field line FL. In this manner, the field line FL and the first magnetic layer 56S can function as a write element that writes the magnetic domain in the magnetization direction according to the recording information to the write position in the magnetic member 52.

Figure 4:
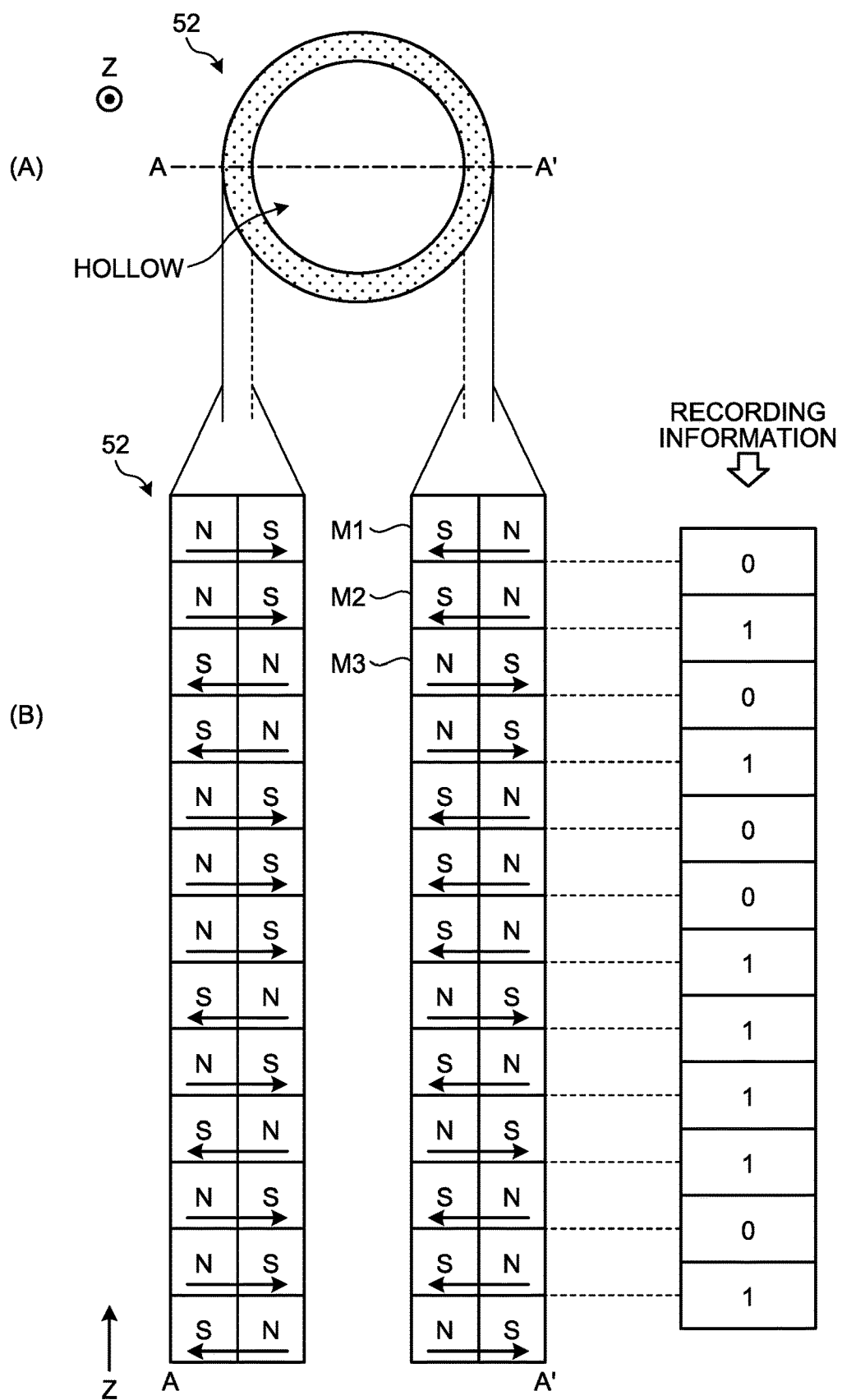
FIG. 4 is a diagram illustrating an example of magnetic domains and recording information retained by a magnetic member.

FIG. 4 is a diagram illustrating an example of magnetic domains and recording information retained by the magnetic member 52. More specifically, a section (A) in FIG. 4 is a schematic diagram of the magnetic member 52 as viewed from the Z direction. A section (B) in FIG. 4 illustrates an example of magnetization directions of a plurality of magnetic domains retained in a region cut by line A-A' in the section (A) in FIG. 4 in the magnetic member 52, and the recording information indicated by the magnetization directions of the plurality of magnetic domains.

The magnetic member 52 can retain a plurality of magnetic domains along the length direction (Z direction). Note that, in the section (B) in FIG. 4, the upper side in the figure is in contact with the magnetoresistance effect element 56. In the example of the section (B) in FIG. 4, the magnetic member 52 retains magnetic domains M1, M2, M3, . . . , and the like from the side of the magnetoresistance effect element 56.

Each magnetic domain is magnetized in the first direction or the second direction opposite to the first direction. As illustrated in FIG. 4, each magnetic domain has a magnetization direction formed in the order of the N pole and the S pole from an outer circumference side, and has, on the contrary, a magnetization direction formed in the order of the S pole and the N pole from the outer circumference side. Note that the magnetization direction of each magnetic domain may be perpendicular to the length direction (Z direction) of the magnetic member 52 (perpendicular magnetic film), or may be the length direction (Z direction) of the magnetic member 52 (in-plane magnetic film).

For example, in a case where the magnetization directions of two magnetic domains adjacent in the length direction (Z direction) of the magnetic member 52 are the same, the magnetic member 52 stores first data in the two magnetic domains. In a case where the magnetization directions of two adjacent magnetic domains are different, the magnetic member 52 stores second data different from the first data in the two magnetic domains. For example, the magnetic member 52 stores "0" in the two magnetic domains in the case where the magnetization directions of the two adjacent magnetic domains are the same. For example, the magnetic member 52 stores "1" in the two magnetic domains in the case where the magnetization directions of the two adjacent magnetic domains are different.

In a case where the magnetization directions of two adjacent magnetic domains are different as in M2 and M3, a magnetic domain wall is generated between the magnetic domain and the magnetic domain. However, in the case where the magnetization directions of adjacent magnetic domains are the same as in M1 and M2, no magnetic domain wall is generated between the magnetic domain and the magnetic domain.

Figure 5:
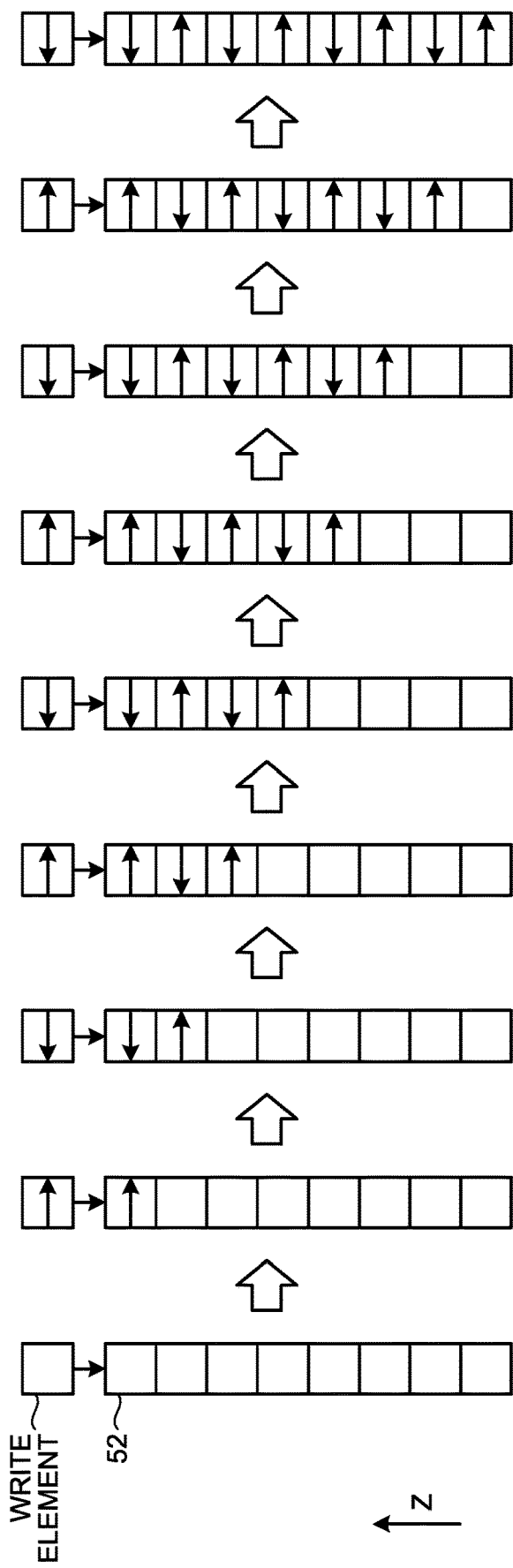
FIG. 5 is a diagram illustrating a shift example of the magnetic domains at the time of writing.

FIG. 5 illustrates an example of the magnetic domains retained in the magnetic member 52 at the time of writing. The magnetic member 52 shifts the retained magnetic domains along the length direction (Z direction). More specifically, in a case where the shift pulse current is supplied once, the magnetic member 52 shifts all the retained magnetic domains by one magnetic domain in the length direction.

In the magnetic member 52, one magnetic domain in the magnetization direction according to the write current is written to the write position (the end portion on the side of the write element) by single write processing. After the write processing is completed once, the shift pulse current for shifting all the retained magnetic domains in a direction away from the write position is supplied to the magnetic member 52. As a result, the magnetic member 52 can be emptied at the write position, and becomes able to write a next new valid magnetic domain.

Thereafter, the write processing and the supply of the shift pulse current are alternately performed in the magnetic member 52. Then, when the initially written magnetic domain reaches the end portion (tail position) of the magnetic member 52 on the opposite side of the write element, a new magnetic domain can no longer be written to the magnetic member 52.

As described above, a new magnetic domain is written to the write position in the magnetic member 52 while the already written magnetic domains are shifted in the direction toward the tail position.

Figure 6:
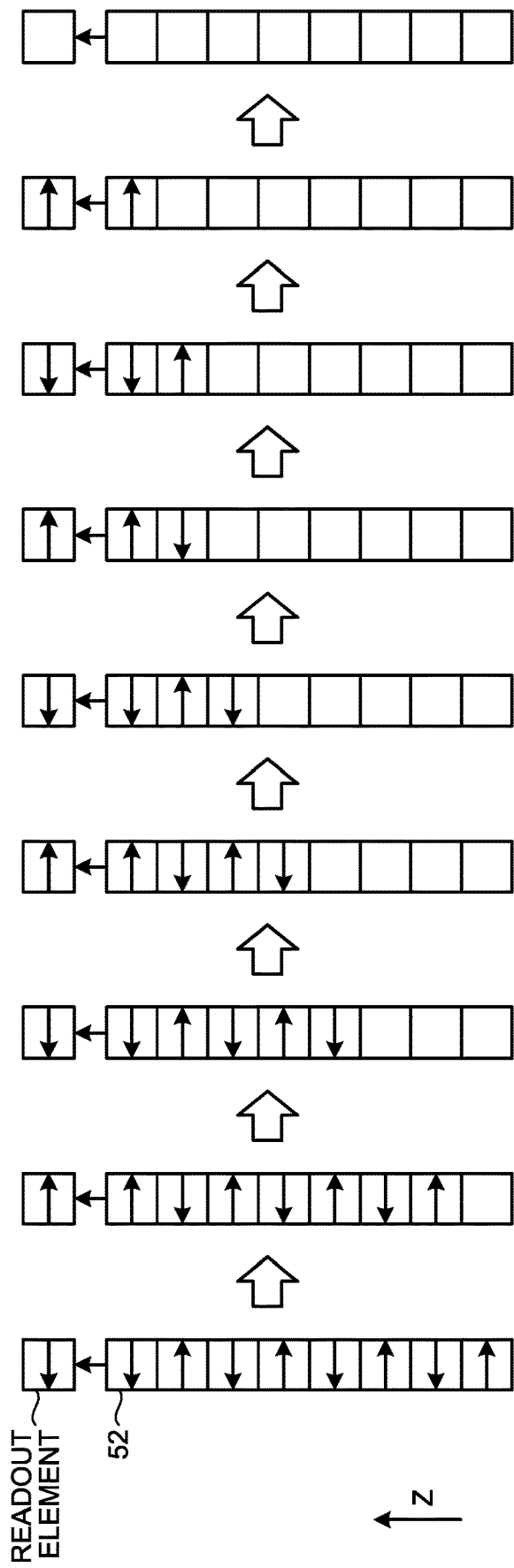
FIG. 6 is a diagram illustrating a shift example of the magnetic domains at the time of reading.

FIG. 6 illustrates an example of the magnetic domains retained in the magnetic member 52 at the time of reading.

In the magnetic member 52, the magnetization direction of one magnetic domain retained at the readout position (the end portion on the side of the readout element) is read by single readout processing. After the readout processing is completed once, the shift pulse current for causing all the retained magnetic domains to approach the readout position is supplied to the magnetic member 52. As a result, the magnetic member 52 allows a magnetic domain next to the most recently read magnetic domain to be readable.

Thereafter, the readout processing and the supply of the shift pulse current are alternately performed in the magnetic member 52. Then, when the magnetic domain written at the tail position reaches the readout position, all the magnetic domains are read from the magnetic member 52.

As described above, the magnetic domains of the magnetic member 52 are sequentially read while the retained magnetic domains are sequentially shifted in the direction toward the readout position. In the magnetic member 52, the shift directions of the magnetic domains are different between the write time and the read time. Therefore, in the magnetic member 52, the shift pulse currents in different directions flow at the write time and the read time.

Figure 7:
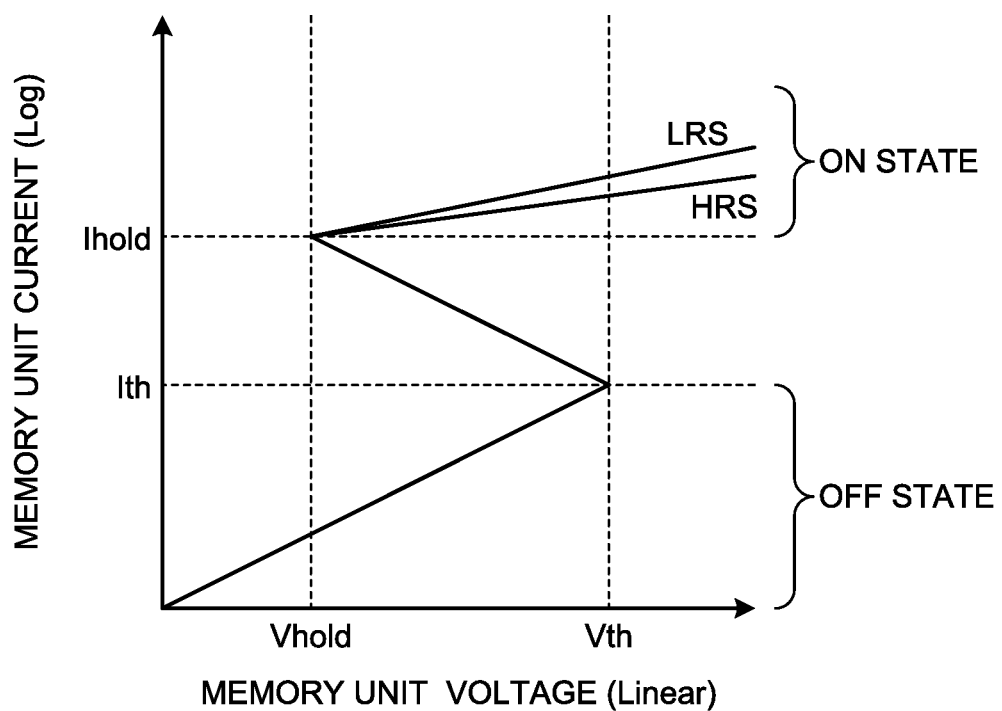
FIG. 7 is a diagram illustrating characteristics of a voltage applied to a memory unit and a current flowing through the memory unit.

FIG. 7 is a diagram illustrating characteristics of a voltage applied to the memory unit 50 and a current flowing through the memory unit 50.

In an initial state where the memory unit voltage applied to the memory unit 50 is 0 and the memory unit current flowing through the memory unit 50 is 0, the selector element 54 is in the off state. Assume that the memory unit voltage gradually increases in the off state of the selector element 54. In this case, the selector element 54 maintains the off state until the memory unit voltage reaches a predetermined threshold voltage value ($V_{th}$). However, when the memory unit voltage becomes equal to or larger than the threshold voltage value ($V_{th}$) and the memory unit current becomes equal to or larger than a threshold current value ($I_{th}$), the selector element 54 changes from the off state to the on state.

When the selector element 54 changes from the off state to the on state, the resistance value of the selector element 54 abruptly decreases. Therefore, when the selector element 54 changes from the on state to the off state, the memory unit voltage steeply falls to a holding voltage value ($V_{hold}$). Meanwhile, the memory unit current steeply rises to the holding current value ($I_{hold}$).

The selector element 54 maintains the on state when the current equal to or larger than the holding current value ($I_{hold}$) continues to flow in the on state. However, when the flowing current becomes smaller than the holding current value ($I_{hold}$), the selector element 54 cannot maintain the on state and changes to the off state.

Further, the magnetoresistance effect element 56 has a different resistance value according to the recorded magnetization direction. For example, the magnetoresistance effect element 56 enters the low resistance state (LRS) in the case of being magnetized in the first direction, and enters the high resistance state (HRS) in the case of being magnetized in the second direction opposite to the first direction. Therefore, the memory unit 50 has different voltage-current characteristics depending on whether the magnetoresistance effect element 56 is in the low resistance state (LRS) or in the high resistance state (HRS), in the on state.

Therefore, the readout control circuit 34 can detect the magnetization direction stored by the magnetoresistance effect element 56 by applying a constant voltage to the memory unit 50 and measuring a value of a flowing current in the on state of the selector element 54. Alternatively, the readout control circuit 34 can detect the magnetization direction stored by the magnetoresistance effect element 56 by applying a constant current to the memory unit 50 and measuring a value of an applied voltage in the on state of the selector element 54.

Figure 8:
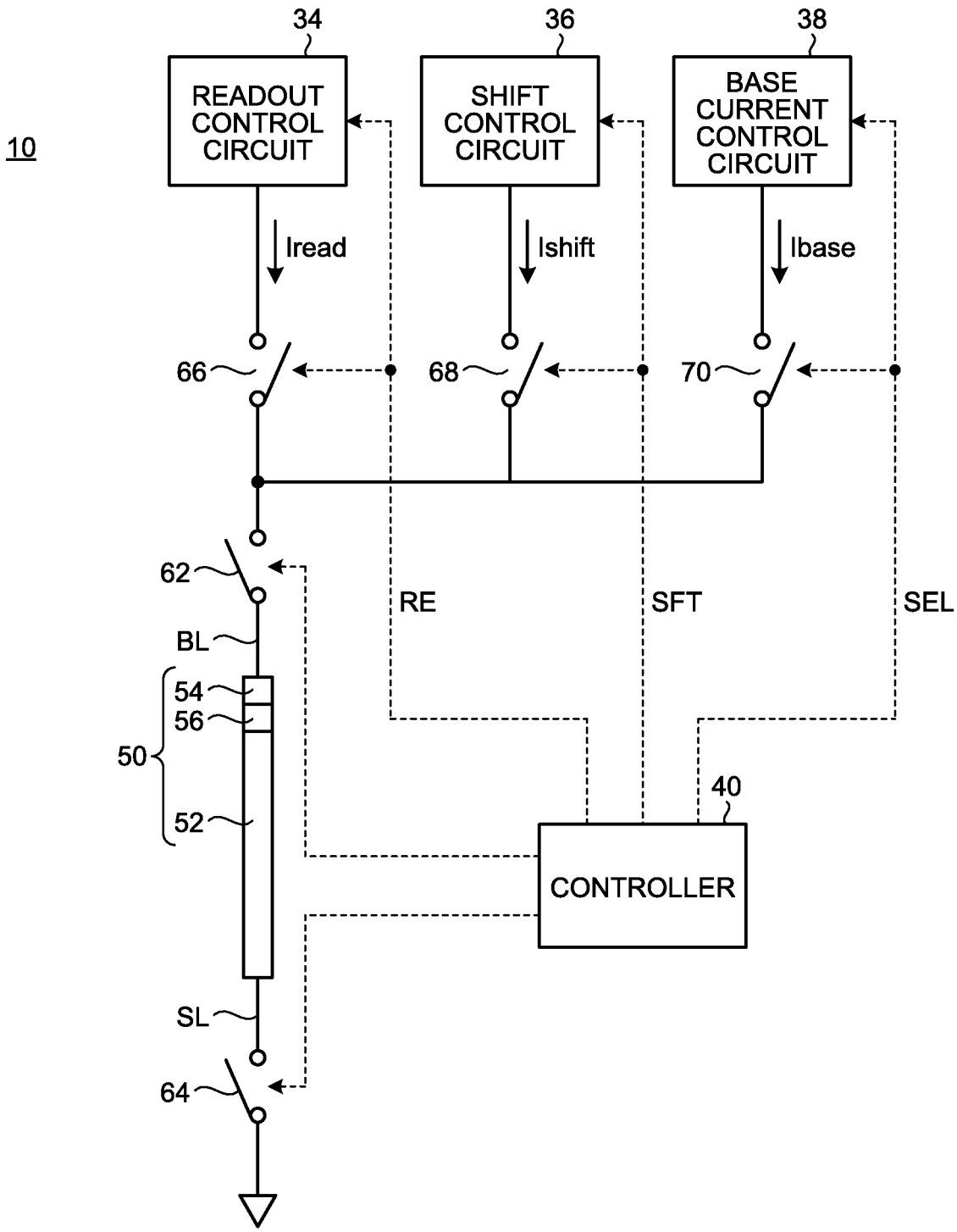
FIG. 8 is a block diagram illustrating a configuration for reading information from a target memory unit.

FIG. 8 is a block diagram illustrating a configuration for reading information from a target memory unit 50. As a configuration for reading information from the target memory unit 50, the magnetic storage device 10 includes a bit line switch 62, a source line switch 64, the readout control circuit 34, a readout current switch 66, the shift control circuit 36, a shift current switch 68, the base current control circuit 38, a base current switch 70, and the controller 40.

The bit line switch 62 may be one switch element of a multiplexer that switches connection of the plurality of bit lines BL. This multiplexer is, for example, controlled to be switched in response to a selection operation by the bit line decoder 22.

The source line switch 64 connects or disconnects the source line SL to which the target memory unit 50 is connected and the ground. The source line switch 64 may be one switch element of a multiplexer that switches connection between the plurality of source lines SL and the ground. This multiplexer is, for example, controlled to be switched in response to a selection operation by the source line decoder 24.

The readout control circuit 34 supplies a readout current ($I_{read}$) to the magnetoresistance effect element 56 included in the target memory unit 50 via the bit line BL. As a result, the readout control circuit 34 can acquire information of the magnetization direction of the magnetic domain retained at the readout position.

The readout current switch 66 is provided between the readout control circuit 34 and the selector element 54. In the present embodiment, the readout current switch 66 is electrically connected to the selector element 54 via the bit line switch 62. The readout current switch 66 electrically connects or disconnects the readout control circuit 34 and the selector element 54. The readout current switch 66 is in a connected state in a case where the readout current ($I_{read}$) is output from the readout control circuit 34 and is in a disconnected state in other cases according to the control of the controller 40.

The shift control circuit 36 supplies the shift pulse current ($I_{shift}$) to the magnetic member 52 included in the target memory unit 50 via the selector element 54 to shift the magnetic domains retained in the magnetic member 52 in the length direction. The shift pulse current is the amount of current that shifts all the magnetic domains retained in the magnetic member 52 by the length of one magnetic domain.

The shift current switch 68 is provided between the shift control circuit 36 and the selector element 54. In the present embodiment, the shift current switch 68 is electrically connected to the selector element 54 via the bit line switch 62. The shift current switch 68 electrically connects or disconnects the shift control circuit 36 and the selector element 54. The shift current switch 68 is in a connected state in a case where the shift pulse current is output from the shift control circuit 36 and is in a disconnected state in other cases according to the control of the controller 40.

In a case of reading the magnetization direction of the magnetic domain retained in the magnetic member 52, the shift control circuit 36 supplies, to the magnetic member 52, the shift pulse current for shifting the magnetic domains retained in the magnetic member 52 to approach the readout position. Then, in a case of reading the magnetization direction of the magnetic domain retained in the magnetic member 52, the readout control circuit 34 acquires the information of the magnetization direction of the magnetic domain retained at the readout position after the magnetic domains are shifted by the length of one magnetic domain.

Further, in a case of writing the magnetic domain in the magnetization direction according to the recording information to the magnetic member 52, the shift control circuit 36 supplies, to the magnetic member 52, the shift pulse current for shifting the magnetic domains retained in the magnetic member 52 away from the write position. Then, in a case of writing the magnetic domain in the magnetization direction according to the recording information to the magnetic member 52, the write control circuit 32 supplies the write current according to the recording information to the field line FL connected to the target memory unit 50 after the magnetic domains are shifted by the length of one magnetic domain. As a result, the write control circuit 32 can write the magnetic domain in the magnetization direction according to the recording information to the write position in the magnetic member 52.

The base current control circuit 38 supplies the base current ($I_{base}$) equal to or larger than the holding current value ($I_{hold}$) to the selector element 54 included in the target memory unit 50 via the bit line BL during a predetermined continuous supply period. The base current control circuit 38 charges the bit line BL with the base current ($I_{base}$), thereby setting the voltage of the selector element 54 to the holding voltage value ($V_{hold}$) or more to change the selector element 54 to the on state. As a result, the base current control circuit 38 can maintain the selector element 54 in the on state during the continuous supply period after changing the selector element 54 from the off state to the on state.

The base current switch 70 is provided between the base current control circuit 38 and the selector element 54. In the present embodiment, the base current switch 70 is electrically connected to the selector element 54 via the bit line switch 62. The base current switch 70 electrically connects or disconnects the base current control circuit 38 and the selector element 54. The base current switch 70 is in a connected state in a case where the base current ($I_{base}$) is output from the base current control circuit 38, and is in a disconnected state in other cases according to the control of the controller 40.

The controller 40 executes switching control of the bit line switch 62 and the source line switch 64. Further, the controller 40 executes switching control of the readout current switch 66, the shift current switch 68, and the base current switch 70. Further, the controller 40 executes operation control of the write control circuit 32, the readout control circuit 34, the shift control circuit 36, and the base current control circuit 38.

After the selector element 54 changes from the off state to the on state, the controller 40 causes the base current control circuit 38 to supply the base current ($I_{base}$) to the selector element 54 during the predetermined continuous supply period. Then, the controller 40 supplies the shift pulse current to the shift control circuit 36 a plurality of times during a continuous supply period.

Furthermore, in a case of reading the magnetization direction of the magnetic domain retained in the magnetic member 52, the controller 40 causes the readout control circuit 34 to perform the readout processing after causing the shift control circuit 36 to supply the shift pulse current. That is, in the case of reading the magnetization direction of the magnetic domain retained in the magnetic member 52, the controller 40 causes the readout control circuit 34 to acquire the information of the magnetization direction read by the magnetoresistance effect element 56 every time the shift pulse current is supplied to the magnetic member 52. Thereby, the controller 40 can alternately execute the supply of the shift pulse current and the readout processing in the case of reading the magnetization direction of the magnetic domain retained in the magnetic member 52.

Further, in a case of writing the magnetic domain in the magnetization direction according to the recording information to the magnetic member 52, the controller 40 causes the write control circuit 32 not illustrated in FIG. 8 to perform the write processing after causing the shift control circuit 36 to supply the shift pulse current. That is, in the case of writing the magnetic domain in the magnetization direction according to the recording information to the magnetic member 52, the controller 40 causes the write control circuit 32 to write the magnetic domain in the magnetization direction according to the recording information to the magnetic member 52 every time the shift pulse current is supplied to the magnetic member 52. Thereby, the controller 40 can alternately execute the supply of the shift pulse current and the write processing in the case of writing the magnetic domain in the magnetization direction according to the recording information to the magnetic member 52.

Further, the controller 40 may supply the shift pulse current by the same number of times as the number of magnetic domains retainable in the magnetic member 52 during the continuous supply period. As a result, the controller 40 can acquire the information of the magnetization directions of all the magnetic domains retained in the magnetic member 52 during one continuous supply period. In addition, the controller 40 can write the maximum number of retainable magnetic domains to the magnetic member 52 during one continuous supply period.

Figure 9:
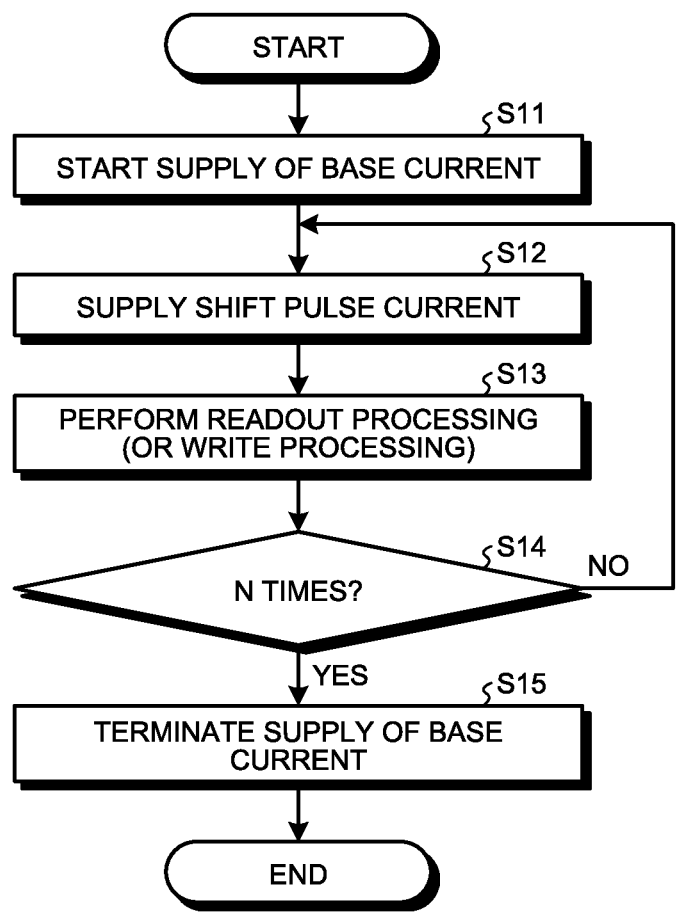
FIG. 9 is a flowchart illustrating a flow of processing by a controller.

FIG. 9 is a flowchart illustrating a flow of processing by the controller 40. In a case of reading a magnetization state from the magnetic member 52 included in the target memory unit 50, the controller 40 executes processing in the flow illustrated in FIG. 9.

First, in S11, the controller 40 instructs the base current control circuit 38 to start supply of the base current. The base current control circuit 38 supplies the base current to the memory unit 50 when receiving the instruction of start of supply. Note that the base current control circuit 38 continues to supply the base current to the memory unit 50 until receiving an instruction to terminate the supply from the controller 40 thereafter. As a result, the selector element 54 included in the memory unit 50 can continue to maintain the on state during the period (continuous supply period) in which the base current is continuously supplied.

Next, in S12, the controller 40 instructs the shift control circuit 36 to supply the shift pulse current for shifting the magnetic domains in the direction approaching the readout position. The shift control circuit 36 supplies the shift pulse current for shifting the magnetic domains in the direction of approaching the readout position to the memory unit 50 when receiving the instruction of supply. As a result, the magnetic member 52 included in the memory unit 50 can shift all the retained magnetic domains in the direction approaching the readout position by the length of one magnetic domain.

In the case of writing the magnetic domain to the magnetic member 52 included in the target memory unit 50, the controller 40 instructs the shift control circuit 36 to supply the shift pulse current for shifting the magnetic domains in the direction away from the write position in S12. The shift control circuit 36 supplies the shift pulse current for shifting the magnetic domains in the direction away from the write position to the memory unit 50 when receiving the instruction of supply. As a result, the magnetic member 52 included in the memory unit 50 can shift all the retained magnetic domains in the direction away from the write position by the length of one magnetic domain.

Next, in S13, the controller 40 instructs the readout control circuit 34 to execute the readout processing. The readout control circuit 34 executes the readout processing when receiving the instruction of execution of the readout processing. As a result, the readout control circuit 34 can acquire the information of the magnetization direction of the magnetic domain retained at the readout position in the magnetic member 52.

In the case of writing the magnetic domain to the magnetic member 52 included in the target memory unit 50, the controller 40 instructs the write control circuit 32 to execute the write processing in S13. The write control circuit 32 executes the write processing when receiving the instruction of execution of the write processing. As a result, the write control circuit 32 can write a new magnetic domain in the magnetization direction according to the recording information to the write position in the magnetic member 52.

Next, in S14, the controller 40 determines whether having executed the processing in S13 N times.

N is the number of magnetic domains retainable by the magnetic member 52. That is, the controller 40 determines whether the magnetization directions of all the magnetic domains retained in the magnetic member 52 have been read (or whether magnetic domains retainable by the magnetic member 52 have been written).

In a case where the processing in S13 has not been executed N times (No in S14), the controller 40 returns the processing to S12 and repeats the processing from S12. In a case where the processing in S13 has been executed N times (Yes in S14), the controller 40 advances the processing to S15.

In S15, the controller 40 instructs the base current control circuit 38 to terminate the supply of the base current. The base current control circuit 38 terminates the supply of the base current to the memory unit 50 when receiving the instruction of termination of supply. With the termination, the selector element 54 included in the memory unit 50 changes from the on state to the off state. Then, when terminating the processing in S16, the controller 40 terminates the processing of the present flow for the target memory unit 50.

Figure 10:
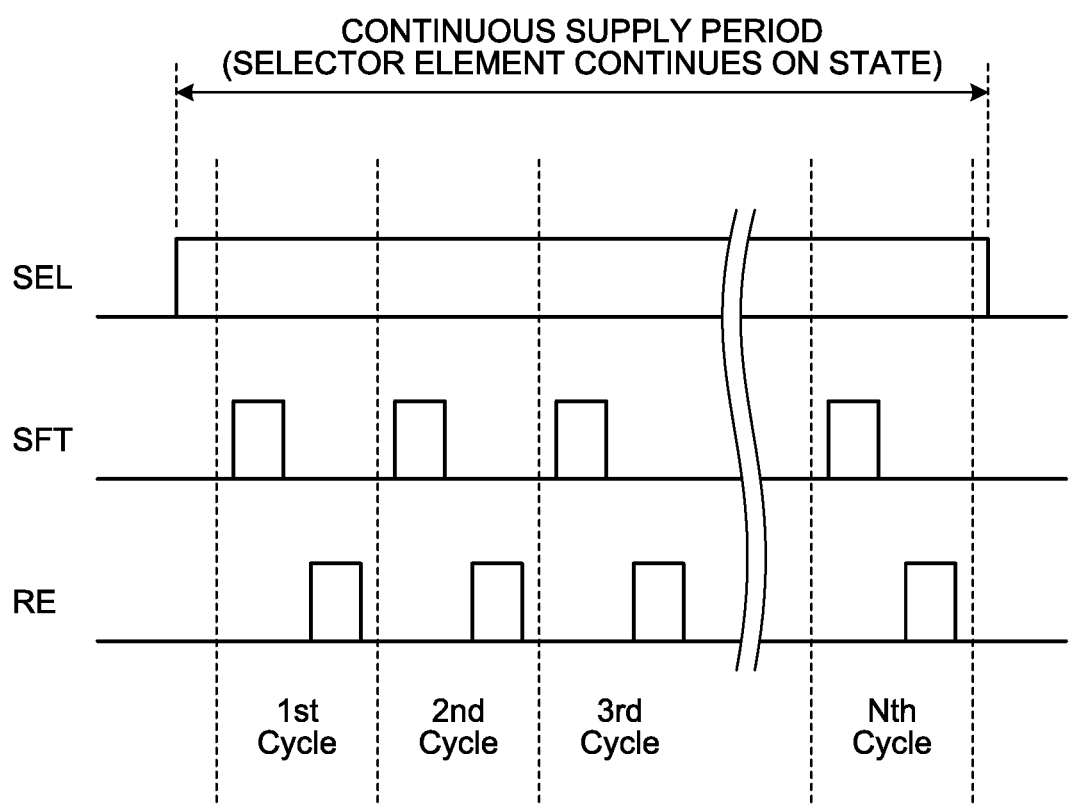
FIG. 10 is a timing chart of control signals output from the controller.

FIG. 10 is a timing chart of control signals output from the controller 40. SEL in FIG. 10 is a control signal for an instruction of an output of the base current, which is given from the controller 40 to the base current control circuit 38 and the base current switch 70. SFT in FIG. 10 is a control signal for an instruction of an output of the shift pulse current, which is given from the controller 40 to the shift control circuit 36 and the shift current switch 68. RE in FIG. 10 is a control signal for an instruction of execution of the readout processing, which is given from the controller 40 to the readout control circuit 34 and the readout current switch 66.

The base current control circuit 38 continues to supply the base current to the selector element 54 during a period in which SEL is supplied from the controller 40 (continuous supply period). As a result, the selector element 54 can continue the on state during the continuous supply period.

Further, the controller 40 alternately generates SFT and RE during the continuous supply period. As a result, the controller 40 can read the magnetization directions from a plurality of magnetic domains by changing the selector element 54 from the off state to the on state only once.

At the time of writing, the controller 40 gives a control signal for an instruction of execution of the write processing to the write control circuit 32 at the timing of generation of RE. As a result, the controller 40 can write a plurality of magnetic domains by changing the selector element 54 from the off state to the on state only once at the time of writing.

Figure 11:
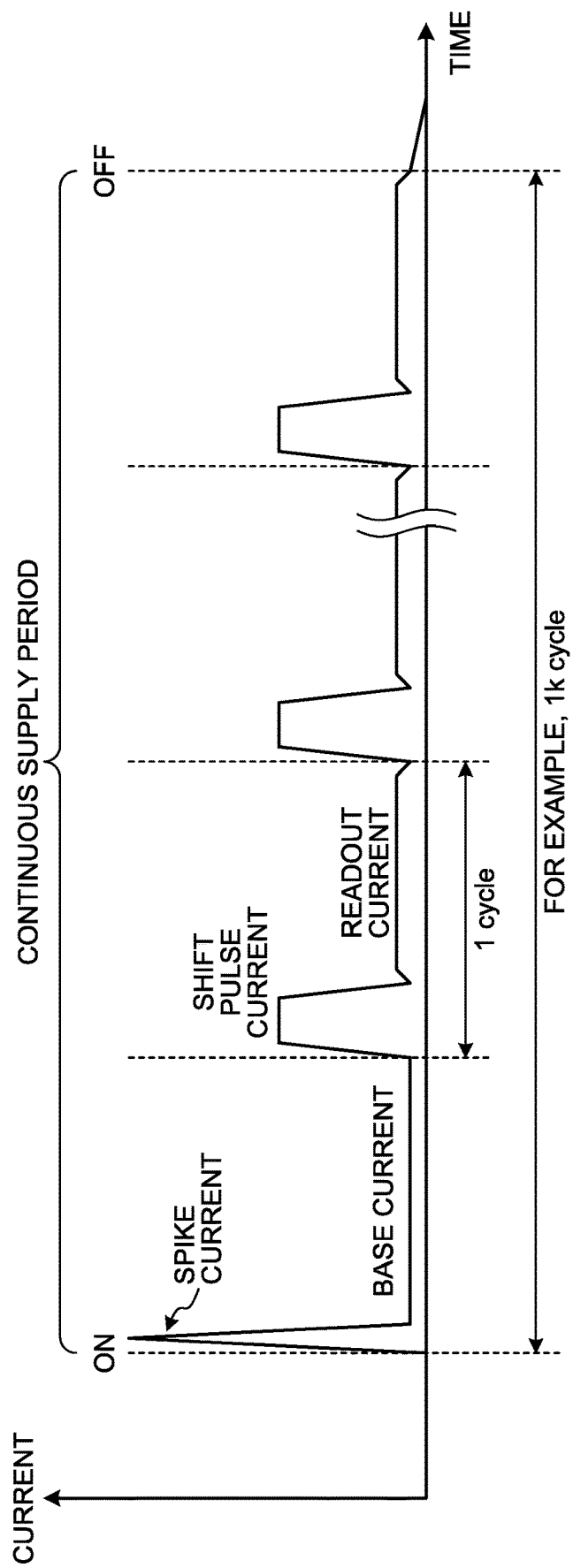
FIG. 11 is a diagram illustrating temporal change in an amount of current flowing in the memory unit at the time of reading.

FIG. 11 is a diagram illustrating temporal change in an amount of current flowing in the memory unit 50 at the time of reading. In a case where the selector element 54 changes from the off state to the on state, a spike current flows in the memory unit 50. The spike current may cause destruction of elements included in the memory unit 50 or may cause erroneous shift of the magnetic domains retained by the magnetic member 52.

For example, in a case of changing the selector element 54 from the off state to the on state every time reading the magnetization direction retained in one magnetic domain (or every time writing the magnetization direction), the spike current flows in the memory unit 50 a very large number of times, and there is a high possibility of destruction of the elements and erroneous shift of the magnetic domains.

In contrast, the magnetic storage device 10 executes a plurality of times of readout processing (or a plurality of times of write processing) every time changing the selector element 54 from the off state to the on state. Therefore, in the magnetic storage device 10, the number of occurrences of the spike current with respect to the number of times of readout processing (and write processing) is reduced.

As described above, in the magnetic storage device 10 according to the present embodiment, the number of occurrences of the spike current can be reduced. Therefore, according to the magnetic storage device 10 of the present embodiment, the erroneous shift is eliminated and information can be stored with high accuracy. Further, according to the magnetic storage device 10 of the present embodiment, the possibility of destruction of the elements and the like can be reduced. Note that FIG. 11 illustrates the temporal change in the current flowing in the memory unit 50 at the time of reading. However, at the time of writing, the base current flows during a period in which a readout current flows.

Figure 12:
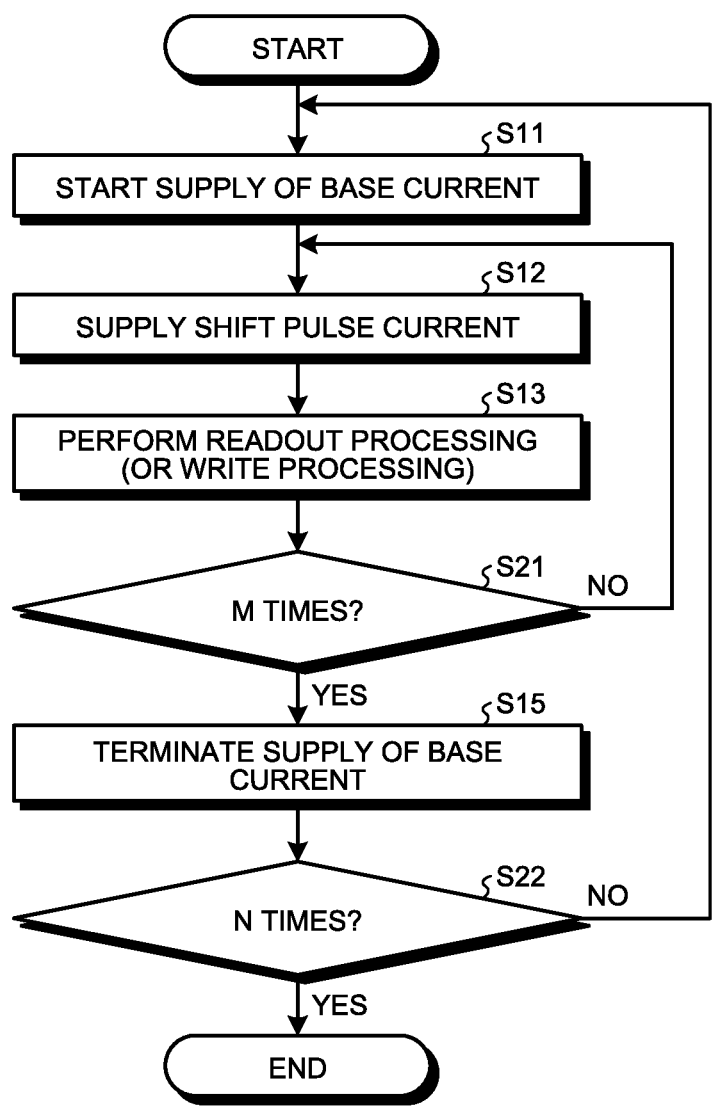
FIG. 12 is a flowchart illustrating a flow of processing by a controller in a modification.

FIG. 12 is a flowchart illustrating a flow of processing by the controller 40 in a modification. The controller 40 may execute processing in the flow illustrated in FIG. 12, in place of the processing illustrated in FIG. 9.

First, in S11 to S13, the controller 40 executes the same processing as the processing illustrated in FIG. 9. The controller 40 advances the processing to S21 when completing S13.

In S21, the controller 40 determines whether having executed the processing in S13 M times.

M is a predetermined number smaller than the number of magnetic domains retainable by the magnetic member 52. For example, in a case where a continuous operable period in which the selector element 54 can be kept in the on state is determined from the viewpoint of reliability, M may be a repetition number that does not exceed at least the continuous operable period.

In a case where the processing in S13 has not been executed M times (No in S21), the controller 40 returns the processing to S12 and repeats the processing from S12. In a case where the processing in S13 has been executed M times (Yes in S21), the controller 40 advances the processing to S15.

In S15, the controller 40 executes the same processing as the processing illustrated in FIG. 9. The controller 40 advances the processing to S22 when completing S15.

Next, in S22, the controller 40 determines whether having executed the processing in S13 N times in total. N is the number of magnetic domains retainable by the magnetic member 52. That is, the controller 40 determines whether the magnetization directions of all the magnetic domains retained in the magnetic member 52 have been read (or whether magnetic domains retainable by the magnetic member 52 have been written).

In a case where the processing in S13 has not been executed N times in total (No in S22), the controller 40 returns the processing to S11 and repeats the processing from S11. In a case where the processing in S13 has been executed N times in total (Yes in S22), the controller 40 terminates the processing of the present flow for the target memory unit 50.

Note that M may be a divisor of N. Thereby, the magnetization directions of the same number of magnetic domains can be read or the same number of magnetic domains can be written during all the continuous supply periods. In addition, the controller 40 may determine whether a predetermined period has elapsed since the selector element 54 entered the on state, as the processing in S21. Here, the predetermined period is a period shorter than the continuous operable period. Thereby, the controller 40 can reliably shorten the period in which the selector element 54 is in the on state than the continuous operable period.

Figure 13:
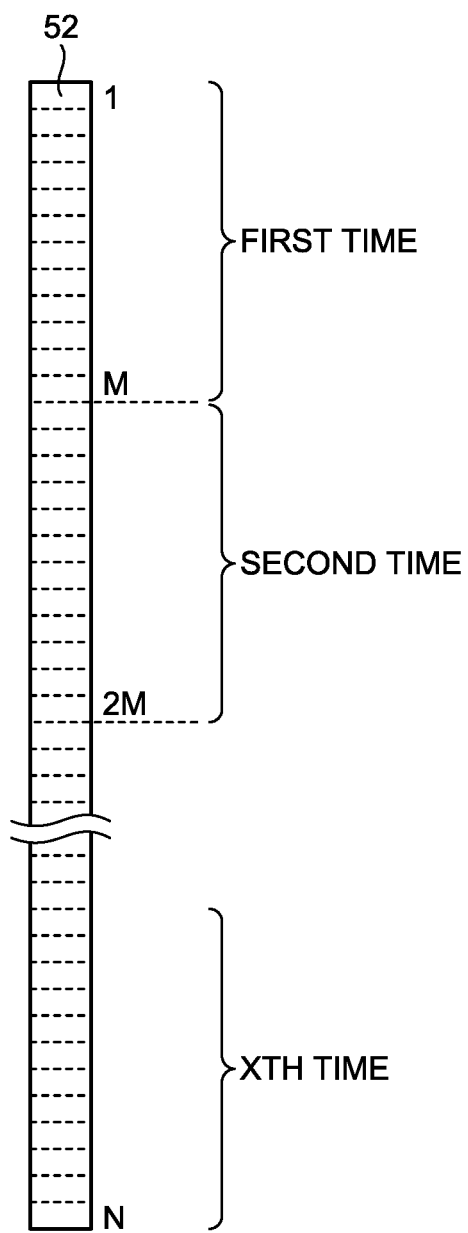
FIG. 13 is a diagram illustrating a range of magnetic domains read in each continuous supply period in the modification.

FIG. 13 is a diagram illustrating a range of magnetic domains read in each continuous supply period in the modification. In the modification, the magnetic storage device 10 sets a plurality of continuous supply periods for one magnetic member 52, and executes readout processing and write processing.

For example, the magnetic storage device 10 reads the magnetization directions of the first to Mth magnetic domains of the magnetic member 52 in the first continuous supply period, and reads the magnetization directions of the (M+1)th to (2×M)th magnetic domains in the second continuous supply period. Then, for example, the magnetic storage device 10 reads the magnetization directions of the (((x−1)×M)+1)th to Nth magnetic domains in the xth (x is an integer of 3 or more) continuous supply period.

In this manner, the magnetic storage device 10 causes the selector element 54 to be in the on state every number of time that is smaller than the number of magnetic domains retainable in the magnetic member 52, thereby increasing the reliability of the selector element 54 while suppressing occurrence of the spike current.

Further, in the above embodiments, the cases where the switch element between two terminals is applied as the selector element 54 have been described. However, a metal oxide semiconductor (MOS) transistor or a FIN transistor, such as a field effect transistor that is a switch element between three terminals, may be applied as the selector element 54. A diode element may also be applied. That is, the memory unit array 20 is not limited to the cross-point type structure, and any arbitrary array structure can be applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic storage device comprising:
a magnetic member that includes a portion extending in a direction;
a switch element that is a two-terminal element connected in series to the magnetic member, changes to an on state in a case where a voltage equal to or larger than a predetermined value is applied in an off state, maintains the on state in a case where a current equal to or larger than a holding current value continues to flow in the on state, and changes to the off state in a case where the current flowing in the on state becomes smaller than the holding current value;
a shift control circuit configured to supply a shift pulse current to the magnetic member via the switch element to shift a magnetic domain retained in the magnetic member;
a base current control circuit configured to supply a base current equal to or larger than the holding current value to the switch element; and
a controller configured to cause the base current control circuit to supply the base current to the switch element during a predetermined continuous supply period after the switch element changes from the off state to the on state, and cause the shift control circuit to supply the shift pulse current a plurality of times during the continuous supply period.

2. The magnetic storage device according to claim 1, wherein
the portion of the magnetic member has a cylindrical shape.

3. The magnetic storage device according to claim 2, wherein
the magnetic member is able to retain a plurality of magnetic domains in a length direction, and moves the retained magnetic domains in response to a current flowing in the length direction.

4. The magnetic storage device according to claim 3, wherein
the switch element is electrically connected to an end portion of the magnetic member in the length direction.

5. The magnetic storage device according to claim 1, wherein
the shift pulse current is an amount of current that shifts all of magnetic domains retained in the magnetic member by a length of one magnetic domain.

6. The magnetic storage device according to claim 5, wherein
the controller supplies the shift pulse current the same number of times as a number of magnetic domains retainable in the magnetic member during the continuous supply period.

7. The magnetic storage device according to claim 5, wherein
the controller supplies the shift pulse current a smaller number of times than a number of magnetic domains retainable in the magnetic member during the continuous supply period.

8. The magnetic storage device according claim 1, further comprising:
a readout element that reads a magnetization direction of a magnetic domain retained at a readout position in the magnetic member, wherein
the shift control circuit supplies the shift pulse current for shifting that the magnetic domain retained in the magnetic member in a direction approaching the readout position in a case where the magnetization direction of the magnetic domain retained in the magnetic member is read.

9. The magnetic storage device according to claim 8, wherein
the readout element is a magnetoresistance effect element.

10. The magnetic storage device according to claim 9, further comprising:
a readout control circuit configured to supply a current to the readout element and acquire information of a magnetization direction of a magnetic domain read by the readout element, wherein
the controller causes the readout control circuit to acquire information of a magnetization direction read by the readout element every time the shift pulse current is supplied to the magnetic member.

11. The magnetic storage device according to claim 9, wherein
the magnetoresistance effect element is provided between the switch element and the magnetic member.

12. The magnetic storage device according to claim 11, wherein
the magnetoresistance effect element is a magnetic tunnel junction (MTJ) element.

13. The magnetic storage device according claim 1, further comprising:
a write element that writes a magnetic domain in a magnetization direction according to recording information to a write position in the magnetic member, wherein
the shift control circuit supplies the shift pulse current for shifting the magnetic domain retained in the magnetic member in a direction away from the write position in a case where a magnetic domain is written to the magnetic member.

14. The magnetic storage device according to claim 13, wherein
the write element includes a field line through which a current flows.

15. The magnetic storage device according to claim 14, wherein
the write element writes a new magnetic domain to the write position by a magnetic field caused by the current flowing through the field line.

16. The magnetic storage device according to claim 15, further comprising:
a write control circuit configured to supply a current to the write element, wherein
the controller causes the write control circuit to write a magnetic domain in a magnetization direction according to the recording information to the magnetic member every time the shift pulse current is supplied to the magnetic member.

17. The magnetic storage device according to claim 1, further comprising:
- a readout element that reads a magnetization direction of a magnetic domain retained at a readout position in the magnetic member; and
- a write element that writes a magnetic domain in a magnetization direction according to recording information to a write position in the magnetic member, wherein
- the readout position and the write position are formed at one end portion of the magnetic member, and
- the shift control circuit causes the shift pulse current to flow in different directions between a case where a magnetization direction of a magnetic domain retained in the magnetic member is read and a case where a magnetic domain is written to the magnetic member.

18. A magnetic storage device comprising:
- a magnetic member that includes a portion extending in a direction;
- a switch element that is a two-terminal element connected in series to the magnetic member, changes to an on state in a case where a voltage equal to or larger than a predetermined value is applied in an off state, maintains the on state in a case where a current equal to or larger than a holding current value continues to flow in the on state, and changes to the off state in a case where the current flowing in the on state becomes smaller than the holding current value;
- a readout element that reads a magnetization direction of a magnetic domain retained at a readout position in the magnetic member;
- a readout control circuit configured to supply a current to the readout element and acquires information of the magnetization direction of the magnetic domain read by the readout element;
- a write element that writes a magnetic domain in a magnetization direction according to recording information to a write position in the magnetic member;
- a write control circuit configured to supply a current to the write element;
- a shift control circuit configured to supply a shift pulse current to the magnetic member via the switch element to shift the magnetic domain retained in the magnetic member;
- a base current control circuit configured to supply a base current equal to or larger than the holding current value to the switch element; and
- the controller configured to cause the base current control circuit to supply the base current to the switch element during a predetermined continuous supply period after the switch element changes from the off state to the on state, and cause the shift control circuit to supply the shift pulse current a plurality of times during the continuous supply period.

* * * * *